(12) United States Patent
Hashimoto (10) Patent No.: US 6,545,228 B2
(45) Date of Patent: Apr. 8, 2003

(54) SEMICONDUCTOR DEVICE WITH A PLURALITY OF STACKED BOARDS AND METHOD OF MAKING

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 09/938,515

(22) Filed: Aug. 27, 2001

(65) Prior Publication Data

US 2002/0027019 A1 Mar. 7, 2002

(30) Foreign Application Priority Data

Sep. 5, 2000 (JP) ........................................ 2000-269102

(51) Int. Cl.[7] ................................................ H05K 1/16
(52) U.S. Cl. ........................ 174/260; 174/255; 174/263; 174/264; 29/830; 361/792
(58) Field of Search ................................ 174/255, 262, 174/264, 265, 266, 260; 361/792, 793, 794, 795; 29/830

(56) References Cited

U.S. PATENT DOCUMENTS

| | | | | |
|---|---|---|---|---|
| 4,149,764 A | * | 4/1979 | Mattingly, Jr. ................ | 439/75 |
| 4,692,843 A | * | 9/1987 | Matsumoto et al. ........ | 361/792 |
| 4,897,918 A | * | 2/1990 | Osaka et al. ................... | 29/830 |
| 5,343,075 A | * | 8/1994 | Nishino ....................... | 257/686 |
| 5,579,207 A | * | 11/1996 | Hayden et al. .............. | 361/790 |
| 5,600,541 A | * | 2/1997 | Bone et al. ................... | 361/707 |
| 5,602,420 A | * | 2/1997 | Ogata et al. ................. | 257/686 |
| 5,723,903 A | * | 3/1998 | Masuda et al. .............. | 257/696 |
| 6,049,467 A | * | 4/2000 | Tamarkin et al. ........... | 361/790 |
| 6,163,957 A | * | 12/2000 | Jiang et al. .................... | 29/852 |
| 6,237,218 B1 | * | 5/2001 | Ogawa et al. ................ | 29/830 |

FOREIGN PATENT DOCUMENTS

JP  A 8-236694  9/1996

* cited by examiner

Primary Examiner—David L. Talbott
Assistant Examiner—Jose' H. Alcala
(74) Attorney, Agent, or Firm—Oliff & Berridge, PLC (57) ABSTRACT

A semiconductor device includes a semiconductor chip and a substrate having an interconnecting pattern formed thereover. The substrate has the semiconductor chip mounted on one surface thereof. The substrate has an outline larger than the semiconductor chip. First terminals are formed in a region outside the region of the substrate in which the semiconductor chip is mounted. Second terminals are a part of the interconnecting pattern which exposes its surface opposite to its surface opposing the semiconductor chip in a region closer to a center of the substrate than the first terminals. The semiconductor chip is electrically connected to the first and second terminals.

20 Claims, 7 Drawing Sheets

SEMICONDUCTOR DEVICE WITH A PLURALITY OF STACKED BOARDS AND METHOD OF MAKING

Japanese Patent Application No. 2000-269102, filed Sep. 5, 2000, is hereby incorporated by reference in its entirety.

BACKGROUND OF THE INVENTION

1. Field of the Invention

The present invention relates to a semiconductor device and method of manufacture thereof, circuit board, and electronic instrument.

2. Description of Related Art

With the increasingly compact nature of electronic instruments, semiconductor devices are known with a stacked construction incorporating a plurality of substrates (interposers) on which semiconductor chips are mounted laminated at high density. By means of this, the area of the circuit board (motherboard) on which the semiconductor devices are mounted is utilized efficiently, and an electronic instrument which is more compact and of high density can be manufactured.

For example, in Japanese Patent Application Laid-Open No. 8-236694, in a semiconductor device of stacked construction, connector terminals connecting upper and lower semiconductor chips are disposed on the extremity of a substrate to avoid a semiconductor chip disposed in a central portion. That is to say, connector terminals are disposed in a region of the substrate outside the semiconductor chip. Therefore, in order to limit the plan surface area of the semiconductor device, the connector terminals are preferably formed to be small and of a narrow pitch.

However, according to this, since the connector terminals are small and of a narrow pitch, in the testing of the electrical characteristics of the semiconductor devices before lamination, special manufacturing equipment must be used. The positioning of the connector terminals of the semiconductor device with respect to the manufacturing equipment is troublesome.

SUMMARY

A semiconductor device according to the first aspect of the present invention comprises:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals.

A semiconductor device according to the second aspect of the present invention comprises a plurality of stacked semiconductor devices, wherein each of the stacked semiconductor devices comprises:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals, wherein the semiconductor chips in upper and lower ones of the stacked semiconductor devices are electrically connected.

A circuit board according to the third aspect of the present invention has the above-mentioned semiconductor device mounted thereon, the circuit board electrically connected to the semiconductor device by the second terminals which the substrate of the lowest one of the stacked semiconductor devices have.

An electronic instrument according to the fourth aspect of the present invention has the above-mentioned semiconductor device.

A method of manufacture of a semiconductor device according to the fifth aspect of the present invention comprises the step of testing an electrical characteristics of the above-mentioned semiconductor device through the second terminals which the substrate have.

A method of manufacture of a semiconductor device according to the sixth aspect of the present invention comprises the step of testing an electrical characteristics of the above-mentioned semiconductor device through the second terminals which the substrate of the lowest one of the stacked semiconductor devices have.

DETAILED DESCRIPTION

The embodiments of the present invention solve the above described problems in the prior art, and its object relates to the provision of a semiconductor device of stacked construction, in which the electrical characteristics can easily be tested and method of manufacture thereof, a circuit board, and an electronic instrument.

(1) This embodiment of the semiconductor device comprises:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals.

According to this embodiment, first and second terminals are formed electrically connected to the semiconductor chip. By means of this, for example, by using the first terminals for electrical connection to another element, and the second terminals for testing of electrical characteristics, a semiconductor device ideally adapted to each purpose can be provided.

(2) In this semiconductor device, the second terminals maybe formed to be larger in plan form than the first terminals.

By means of this, on the substrate, the first terminals, and second terminals larger in plan form, are formed. The first terminals are formed in a region outside the semiconductor chip. Each of the first terminals is smaller in plan form, and therefore the region of formation of the plurality of first terminals outside the semiconductor chip can be made small. By means of this, a semiconductor device of approximately the same size as the semiconductor chip can be provided.

On the other hand, the second terminals are larger in plan form than the first terminals. By means of this, for example, the electrical characteristics of the semiconductor device can easily be tested through the second terminals. That is to say, the first terminals can be made as small as possible, without consideration of the testing of electrical characteristics, in order to provide a semiconductor device which is compact and of high density. Since the second terminals are formed in a region of the substrate inside the first terminals, even if large in plan form, the plan area of the substrate does not need to be wastefully large.

Therefore, a semiconductor device which is compact and of high density, of which the electrical characteristics can easily be tested, can be provided.

(3) In this semiconductor device, the pitch of the second terminals may be wider than the pitch of the first terminals.

By means of this, the pitch of the second terminals is wider than that of the first terminals, and therefore the electrical characteristics can easily be tested, for example without using special manufacturing equipment.

(4) In this semiconductor device, the first terminals may be formed at an extremity of the substrate and arranged along an edge of the semiconductor chip; and the second terminals may be formed in a region including the region in which the semiconductor chip is mounted.

By means of this, since the first terminals are formed arranged along the edge of the semiconductor chip, the size of the outline of the substrate can be made almost the same as the semiconductor chip. On the other hand, since the second terminals are formed in a region of the substrate including the inside of the semiconductor chip, they can be formed in the form of a region with a large two-dimensional extent.

(5) In this semiconductor device, the interconnecting pattern may be formed on each of both surfaces of the substrate.

(6) In this semiconductor device, the substrate may have the interconnecting pattern formed over its surface on which the semiconductor chip is mounted, and the substrate may have a plurality of first and second through holes formed therethrough in its portion overlapping with the interconnecting pattern;

the first terminals may be positioned over the first through holes; and the second terminals may be provided to be exposed through the second through holes.

By means of this, for example, when the second through holes are larger than the first through holes, the electrical characteristics can easily be tested by means of the second terminals exposed by the second through holes.

(7) In this semiconductor device, the first terminals may have projections formed to project from a surface of the substrate.

By means of this, for example, with the substrates disposed in lamination, upper and lower semiconductor chips can be electrically connected by the first terminals. When the second terminals are larger in plan form than the projections of the first terminals, the electrical characteristics can easily be tested by means of the second terminals.

(8) In this semiconductor device, the projections of the first terminals may be formed by a height exceeding the thickness of the semiconductor chip on the substrate, the projections projecting from either surface of the substrate.

By means of this, for example, with the substrates disposed in lamination, the upper and lower semiconductor chips can easily be electrically connected by the first terminals.

(9) In this semiconductor device, the projections of the first terminals may be formed to project through the first through holes from a surface of the substrate opposite to a surface on which the semiconductor chip is mounted.

By means of this, even when the interconnecting pattern is formed on one surface of the substrate, the projections of the first terminals can be made to project to oppose the other surface.

(10) In this semiconductor device, the projections of the first terminals may be bumps provided so as to be electrically connected to the interconnecting pattern.

(11) In this semiconductor device, the first terminals may be a part of the interconnecting pattern.

By means of this, since the first terminals are a part of the interconnecting pattern, the component count of the semiconductor device can be reduced and a low cost semiconductor device can be provided.

(12) In this semiconductor device, the projections of the first terminals may be formed by bending a part of the interconnecting pattern in the direction away from a surface of the substrate.

By means of this, the first terminals are a part of the interconnecting pattern, and the projections of the first terminals are formed by bent portions of the interconnecting pattern. Therefore, the component count of the semiconductor device can be reduced and a low cost semiconductor device can be provided.

(13) This embodiment of the semiconductor device comprises a plurality of stacked semiconductor devices, wherein each of the stacked semiconductor devices comprises:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals, wherein the semiconductor chips in upper and lower ones of the stacked semiconductor devices are electrically connected.

According to this embodiment, a high density and compact semiconductor device of stacked construction can be provided.

(14) This semiconductor device may further comprise external terminals, the substrate of the lowest one of the stacked semiconductor devices having the external terminals, the external terminals projecting from a surface of the substrate opposite to a surface opposing the substrate of another of the stacked semiconductor devices.

(15) In this semiconduct or device, the external terminals may be formed by bending a part of the interconnecting pattern including the second terminals in the direction away from a surface of the substrate.

By means of this, for example, when the second terminals are larger in plan form than the first terminals, the semiconductor device can easily be positioned on the circuit board. Therefore, the yield when the semiconductor device is mounted can be raised.

(16) In this semiconductor device, the external terminals may be provided so as to be electrically connected to the second terminals.

(17) A circuit board of this embodiment has the above-mentioned semiconductor device mounted thereon, the circuit board electrically connected to the semiconductor device by the second terminals which the substrate of the lowest one of the stacked semiconductor devices have.

(18) An electronic instrument of this embodiment has the above-mentioned semiconductor device.

(19) A method of manufacture of a semiconductor device of this embodiment comprises the step of testing an electrical characteristics of the above-mentioned semiconductor device through the second terminals which the substrate have.

According to this embodiment, through the second terminals, the electrical characteristics are tested. For example, when the second terminals are larger than the first terminals in plan form, and when further the pitch of the second terminals is wider than the pitch of the first terminals, the electrical characteristics of the semiconductor device can easily be tested by means of the second terminals, without the use of special manufacturing equipment.

(20) A method of manufacture of this embodiment of a semiconductor device comprises the step of testing an electrical characteristics of the above-mentioned semiconductor device through the second terminals which the substrate of the lowest one of the stacked semiconductor devices have.

According to this embodiment, the electrical characteristics are tested through the second terminals. By means of this, for example, before and after lamination, the testing of electrical characteristics of the semiconductor device can be standardized. When testing the electrical characteristics, standard manufacturing equipment can be used.

The present invention is now described in terms of a number of preferred embodiments, with reference to the drawings. It should be noted, however, that the present invention is not limited to these embodiments.

First Embodiment

Figure 1:
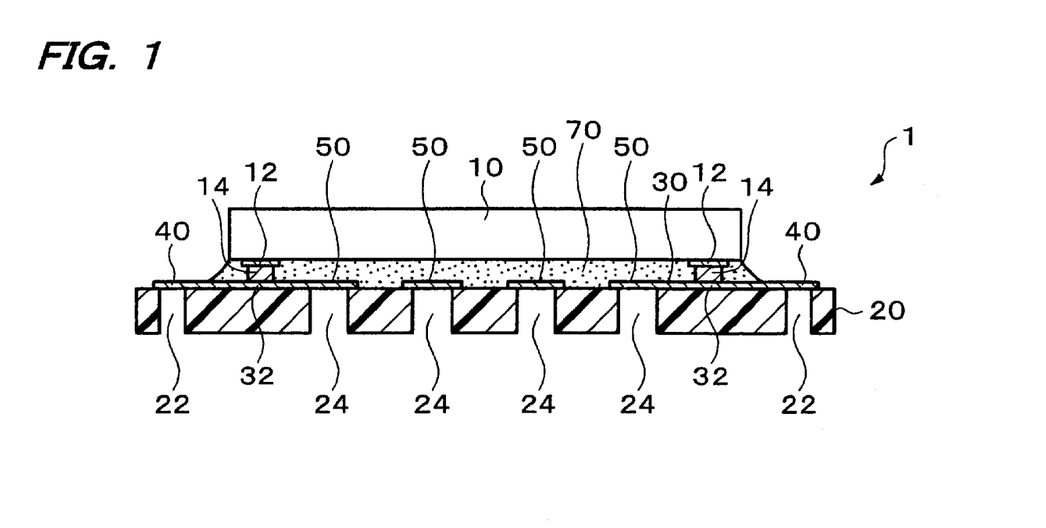
FIG. 1 shows a first embodiment of the semiconductor device to which the present invention is applied.
Figure 2:
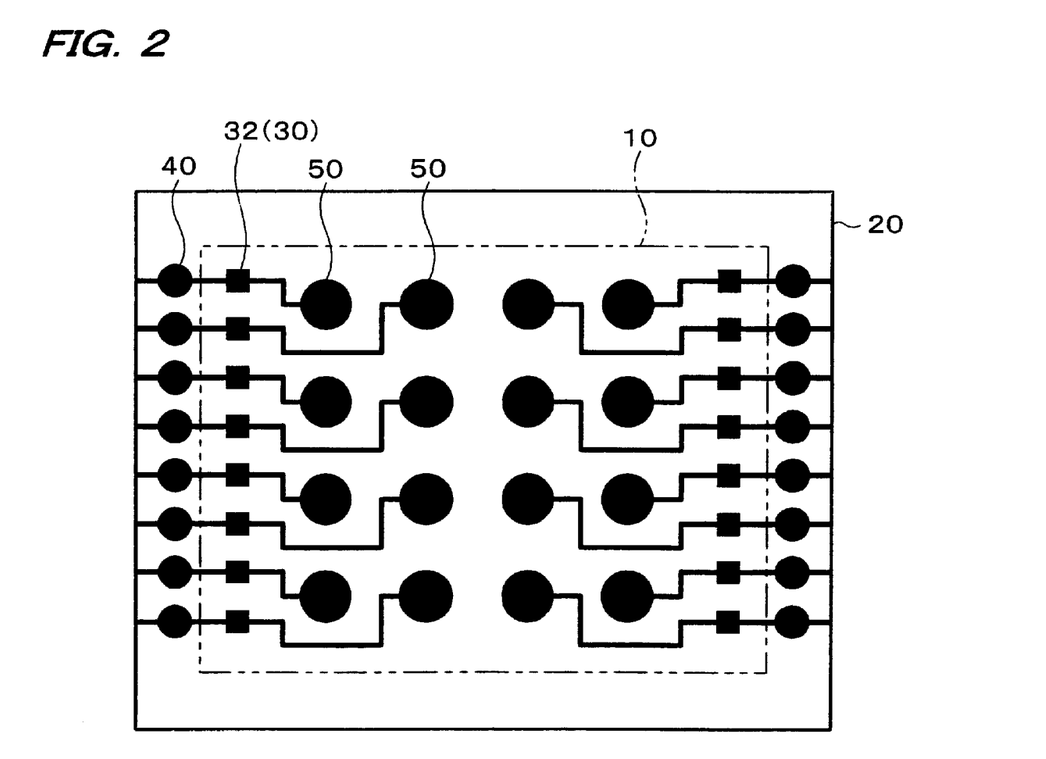
FIG. 2 shows a first embodiment of the semiconductor device to which the present invention is applied.
Figure 3:
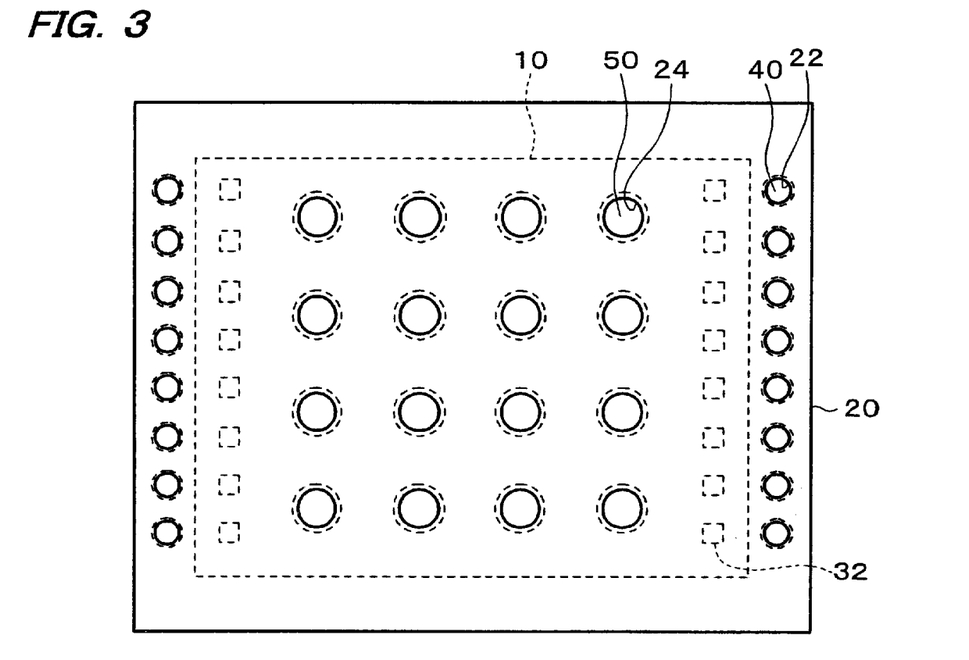
FIG. 3 shows a first embodiment of the semiconductor device to which the present invention is applied.
Figure 4:
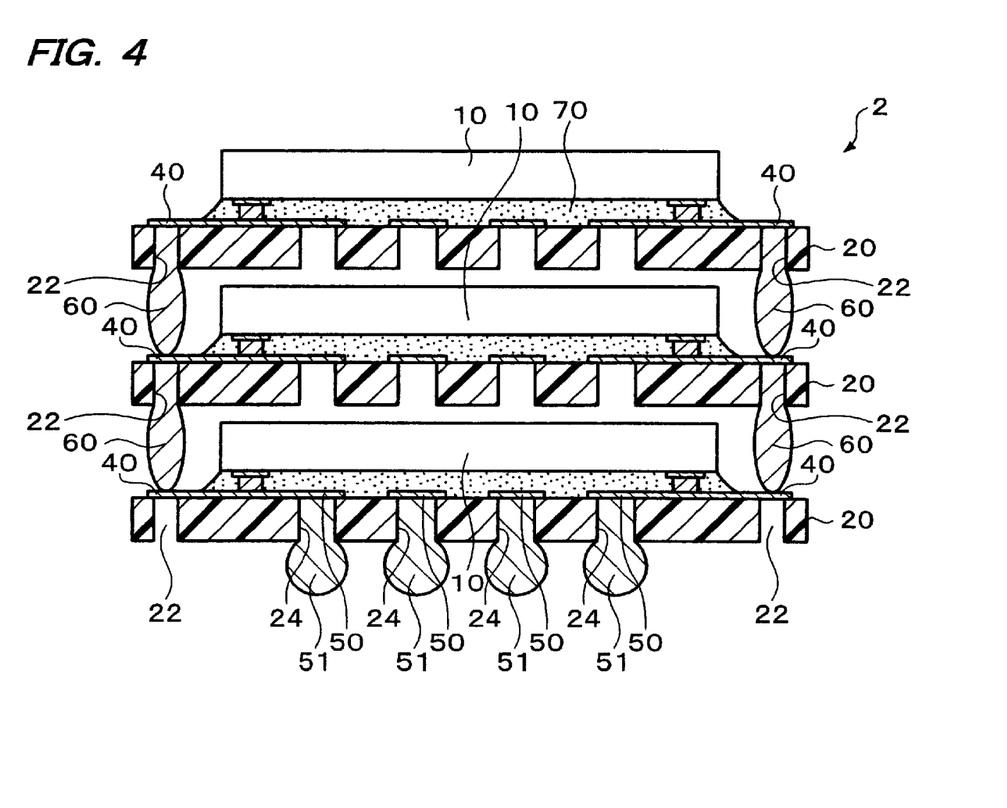
FIG. 4 shows a first embodiment of the semiconductor device to which the present invention is applied.

FIGS. 1 to 4 show this embodiment of a semiconductor device. FIG. 1 is a cross-sectional view of a semiconductor device, and FIGS. 2 and 3 are plan views of a semiconductor device. FIG. 4 shows a so-called semiconductor device of stacked construction in which the semiconductor device shown in FIG. 1 is laminated in multiple stages.

The semiconductor device 1 shown in FIG. 1 comprises a semiconductor chip 10 and a substrate 20. The semiconductor device 1 has the semiconductor chip 10 mounted on the substrate 20.

The outline of the semiconductor chip 10 is commonly rectangular. The semiconductor chip 10 has a plurality of electrodes 12. The electrodes 12 are the electrodes of an integrated circuit formed on the semiconductor chip 10. The electrodes 12 may be formed on the surface having the region in which the integrated circuit is formed on the semiconductor chip 10. The electrodes 12 are commonly formed of the metal used for the interconnecting pattern of the integrated circuit, and typically are formed of aluminum, aluminum alloy, copper, or the like. The electrodes 12 as shown in FIG. 1 may be formed at the extremity of the semiconductor chip 10, or may be formed in a central portion. When the electrodes 12 are arranged along the extremity of the semiconductor chip 10, they may be arranged on a pair of opposite edges or on all four edges. It should be noted that the semiconductor chip 10 may have an insulating film (passivation film) not shown in the drawings formed on the surface having the electrodes 12.

As shown in FIG. 1, on the electrodes 12 may be formed bumps 14. As shown in the drawing, when the semiconductor chip 10 is subjected to face down bonding on the substrate 20, the bumps 14 are preferably formed. The bumps 14 may be formed as projections of nickel or gold plated nickel, solder, or gold or the like. Between the electrodes 12 and the bumps 14, as a layer to prevent diffusion of the bump metal may be added nickel, chromium, titanium or the like.

The substrate 20 may be formed from either an organic or inorganic material, or from a composite structure thereof. As an example of an organic substrate may be cited a flexible substrate of a polyimide resin. As an inorganic substrate may be cited a ceramic substrate or a glass substrate. As a substrate with a composite structure may be cited a glass epoxy substrate. The thickness of the substrate 20 is commonly determined by the material properties. It should be noted that as the substrate 20 a multi-layer substrate or built-up substrate may be used.

As shown in FIG. 1, the substrate 20 has an outline larger than the semiconductor chip 10. In more detail, the substrate 20 protrudes in at least a part beyond the outline of the mounted semiconductor chip 10. When the semiconductor chip 10 is rectangular in shape, the substrate 20 may form a rectangle larger than the outline of the semiconductor chip 10.

As shown in FIG. 1, the semiconductor chip 10 is mounted on one surface of the substrate 20. In the example shown in the drawings, a single semiconductor chip 10 is mounted on the substrate 20. Alternatively, two or more semiconductor chips 10 may be mounted on the substrate 20. In this case, the plurality of semiconductor chips 10 may be disposed to be arranged in a plane, or may be disposed so as to be laminated. When the plurality of semiconductor chips 10 is arranged in a plane, the substrate 20 has an outline which protrudes beyond the region in which the plurality of semiconductor chips 10 is mounted.

On the substrate 20, an interconnecting pattern 30 is formed. In this embodiment, the interconnecting pattern 30 is formed on one surface of the substrate 20. As shown in FIG. 1, the interconnecting pattern 30 may be formed on the side of the substrate 20 on which the semiconductor chip 10 is mounted.

FIG. 2 is a plan view of the surface of the substrate 20 on which the interconnecting pattern 30 is formed. The interconnecting pattern 30 includes a plurality of interconnecting lines in a particular pattern. In other words, by forming the plurality of interconnecting lines in a particular pattern on the substrate 20, the interconnecting pattern 30 is formed on the surface of the substrate 20. The interconnecting pattern 30 is formed, for example, of a conducting material such as copper or the like. The interconnecting pattern 30 may be formed by photolithography, sputtering or plating or the like. It should be noted that the interconnecting pattern 30 may, as shown in the third embodiment, be formed on both surfaces of the substrate 20.

The interconnecting pattern 30 further includes electrical connections 32. As shown in FIG. 2, the electrical connections 32 may be formed to be larger in area than the interconnecting lines connected to the electrical connections 32. That is to say, the electrical connections 32 may be lands.

The electrical connections 32 are electrically connected to the electrodes 12 of the semiconductor chip 10. As shown in FIG. 1, the semiconductor chip 10 maybe mounted on the substrate 20 with the surface having the electrodes 12 opposed. That is to say, the semiconductor chip 10 may be subjected to face down bonding. In this case, the electrical connections 32 are formed in the region of the substrate 20 inside the semiconductor chip 10. Further in this case, the electrodes 12 and electrical connections 32 may be connected through the bumps 14. For the form of bonding of the electrodes 12 (bumps 14) and electrical connections 32, bonding by means of an anisotropic conducting material, metal bonding, bonding by means of the contraction force of a conducting paste or insulating resin and so on exist, and any of them may be used.

It should be noted that as shown in FIG. 1, between the semiconductor chip 10 and the substrate 20, some resin 70 is preferably present. By means of this, the mounting reliability between the semiconductor chip 10 and the substrate 20 can be improved.

Alternatively, the semiconductor chip 10 may be mounted on the substrate 20 such that the surface opposite that of the electrodes 12 opposes the substrate. In this case, the electrodes 12 and electrical connections 32 may be electrically connected by wires. In this case, the electrical connections 32 are formed in a region of the substrate 20 outside the semiconductor chip 10.

Alternatively, as is known as the TAB (Tape Automated Bonding) method, the technique may be applied in which finger leads projecting from a substrate 20 having a device hole larger than the semiconductor chip 10 into the device hole, and the electrodes 12 of the semiconductor chip 10 or bumps 14 are bonded.

These semiconductor chip bonding constructions can be applied to all of the subsequently described embodiments.

As shown in FIGS. 1 and 2, a plurality of first terminals 40 is formed in a region of the substrate 20 outside the region in which the semiconductor chip 10 is mounted. The first terminals 40 are electrically connected to the semiconductor chip 10. In more detail, the first terminals 40 are electrically connected to the electrical connections 32 of the interconnecting pattern 30. In other words, an interconnecting line is formed to extend from each electrical connection 32, and is electrically connected to one of the first terminals 40.

In this embodiment, as shown in FIG. 1 the first terminals 40 are a part of the interconnecting pattern 30. The first terminals 40 may be lands of the interconnecting pattern 30.

The first terminals 40 may be terminals for electrical connection to another semiconductor device. For example, when a plurality of semiconductor devices is laminated in multiple stages, the upper and lower semiconductor chips 10 of each substrate 20 may be electrically connected by the first terminals 40 (see FIG. 4). In this case, since the first terminals 40 must be provided so as to avoid the semiconductor chip 10 of the corresponding substrate 20, they are provided in a region of the substrate 20 outside the region in which the semiconductor chip 10 is mounted. Here, in order to avoid wastefully expanding the outline of the substrate 20, the plurality of first terminals 40 is preferably kept to a small region of formation. That is to say, the plan form of each of the plurality of first terminals 40 is made relatively small, and moreover the pitch of adjacent first terminals 40 is preferably formed to be small. This embodiment, as described below, is particularly effective in this regard.

As shown in FIG. 2, the first terminals 40 may be formed at the extremity of the substrate 20. The first terminals 40 may be formed at the extremity of the substrate 20, and arranged along the edge of the semiconductor chip 10. By means of this, the region of formation of the plurality of first terminals 40 is kept small, and the outline of the substrate 20 can be made approximately the same size as the semiconductor chip 10. The first terminals 40 maybe formed in one row, two rows, or a larger number of rows, or may be arranged in a zigzag. It should be noted that the first terminals 40, as shown in FIG. 2, may be formed on the outside of the electrical connections 32 on the substrate 20. Alternatively, when the electrical connections 32 are formed in the region outside the region in which the semiconductor chip 10 is mounted, the first terminals 40 may be formed on the inside of the electrical connections 32 on the substrate 20.

As shown in FIGS. 1 and 2, second terminals 50 are formed in a region inside the first terminals on the substrate 20. The second terminals 50 are electrically connected to the semiconductor chip 10. In more detail, the second terminals 50 are electrically connected to the electrical connections 32 of the interconnecting pattern 30. That is to say, an interconnecting line is formed to extend from each electrical connection 32, and is electrically connected to one of the first terminals 40 and one of the second terminals 50.

The second terminals 50 are a part of the interconnecting pattern 30. The second terminals 50 may be lands of the interconnecting pattern 30.

As shown in FIG. 2, the second terminals 50 may be formed to be larger in plan form than the first terminals 40. For example, as shown in the drawing, when the first and second terminals 40 and 50 are lands of the interconnecting pattern 30, the diameter of the lands of the second terminals 50 may be formed to be larger than the lands of the first terminals 40.

The plurality of second terminals 50 may be disposed so that the pitch is larger than the pitch of the plurality of first terminals. That is to say, the plurality of second terminals 50 may be subject to "pitch conversion" with respect to the plurality of first terminals 40. For example, as shown in the example in FIG. 2, with the plurality of first terminals 40 arranged in a single row along the edge of the semiconductor chip 10, the plurality of second terminals 50 may be formed with a wider pitch in a region extending two-dimensionally inside the first terminals 40. In this case, the second terminals 50 may be formed in a region including the inside of the semiconductor chip 10 on the substrate 20 (the region of the substrate 20 in which the semiconductor chip 10 is mounted). The plurality of second terminals 50, as shown in FIG. 2, may be disposed arranged in a matrix of a plurality of rows and a plurality of columns, or in a zigzag.

As described above, the first terminals 40 are formed in a region on the outside of the semiconductor chip 10, and therefore are preferably formed with a small plan form, and with a narrow pitch. By means of this, the plan area of the semiconductor device can be made approximately the same size as the semiconductor chip 10. On the other hand, the second terminals 50 differ from the first terminals 40, for example, in that since they are formed in a region including the inside of the semiconductor chip 10, they can be disposed in a region larger than the first terminals 40. That is to say, the second terminals 50 are not restricted by the plan area of the semiconductor device, and can be formed with a large plan form, and a wide pitch.

As shown in FIG. 1, the second terminals 50 are exposed on the side of the substrate 20 opposite to that on which the semiconductor chip 10 is mounted. By means of this, using the second terminals 50, from the side of the substrate 20 opposite to that of the semiconductor chip 10, for example, the electrical characteristics of the semiconductor device can be tested.

FIG. 3 is a plan view of the side of the substrate 20 opposite to the interconnecting pattern 30. As shown in FIGS. 1 and 3, in the substrate 20, a plurality of first and second through holes 22 and 24 may be formed. The first and second through holes 22 and 24 may be formed in a portion overlying the interconnecting pattern 30.

In this embodiment, the lands which are the first terminals 40 are exposed by the first through holes 22, and the lands which are the second terminals 50 are exposed by the second through holes 24. In other words, the interconnecting pattern 30 may be formed on the side of the substrate 20 on which the semiconductor chip 10 is arranged, and the surface of the interconnecting pattern 30 facing the substrate 20 may be exposed through the first and second through holes 22 and 24. The plan form of the first and second through holes 22 and 24 may, as shown in FIG. 3, be circular, or may be square.

As shown in FIG. 3, the pitch of the second through holes 24 is formed to be larger than the pitch of the first through holes 22 in the plan view of the substrate 20. At the same time, the plan form of the second through holes 24 (the through hole diameter) may be larger than the plan form of the first through holes 22. Since the pitch of the second through holes 24 is more than the pitch of the first through holes 22, on the opposite side of the substrate 20 from the semiconductor chip 10, the exposed surface of the second terminals 50 can be arranged with a large pitch. By means of such second terminals 50, the electrical characteristics of the semiconductor device can be tested easily.

According to this embodiment, the first terminals 40 and second terminals 50 arranged with a larger pitch are formed on the substrate 20. The first terminals 40 are formed in a region on the outside of the semiconductor chip 10. Since the first terminals 40 are arranged with a narrow pitch, the region of formation of the plurality of first terminals 40 on the outside of the semiconductor chip 10 can be made small. By means of this, a semiconductor device of approximately the same size as the semiconductor chip 10 can be provided.

On the other hand, the pitch of the second terminals 50 is larger than the pitch of the first terminals 40. The second terminals 50 may in plan form be larger than the first terminals 40. By means of this, for example, through the second terminals 50 the electrical characteristics of the semiconductor device can be tested easily. That is to say, in order to provide a semiconductor device which is compact and of high density, the first terminals 40 can, without consideration of the testing of electrical characteristics, be made as small as possible (both of narrow pitch and small plan form). Since the second terminals 50 are formed in a region inside the first terminals 40 of the substrate 20, even if they are large in plan form, it is not necessary to make the plan area of the substrate 20 wastefully large.

Therefore, at the stage of an individual semiconductor device, a semiconductor device can be provided which is compact and of high density, and of which the electrical characteristics can easily be tested.

A semiconductor device 2 shown in FIG. 4 has the so-called stacked construction in which a plurality of semiconductor devices is laminated. The plurality of semiconductor devices before lamination in the stacked construction may be the semiconductor devices 1 described above. The semiconductor chip 10 of each of the substrates 20 is electrically connected in the vertical direction by the first terminals 40. In this case, as shown in the drawing, the plurality of semiconductor devices 1 is laminated with disposition in such a way that the first terminals 40 formed on one of the substrates 20 overlie in plan view the first terminals 40 of another substrate 20.

As shown in FIG. 4, by forming a plurality of semiconductor chips 10 into a semiconductor device, in particular, when the plurality of semiconductor chips 10 has the same circuit construction, for each of the semiconductor chips, electrical connection of the same second electrodes 50 can be achieved. For example, when the plurality of semiconductor chips 10 is memory, the second terminals 50 of one semiconductor chip 10, as address terminals or data terminals, can easily be shared. In more detail, from the second terminals 50 of one semiconductor chip 10, the data in the memory cell at the same address in each of the semiconductor chips 10 can be read out or written.

Upper and lower semiconductor chips 10 may be electrically connected together by connection of corresponding first terminals 40 with a conducting material 60 interposed. The conducting material 60 may be formed as bumps. The bumps may be formed of a conducting paste such as solder or the like. By forming the conducting material 60 on the substrate 20 with a height exceeding the thickness of the semiconductor chip 10, upper and lower first terminals 40 can be connected together.

In the semiconductor device with a stacked construction, the second terminals 50 formed on the lowest substrate 20 are formed to be large in plan form, and wide in pitch. Then via the second terminals 50 of the lowest substrate 20, the electrical characteristics of the semiconductor device of stacked construction can be tested. By means of this, without using special manufacturing equipment, testing can be carried out easily.

Furthermore, before and after lamination, the testing of electrical characteristics of the semiconductor device can be standardized. When testing the electrical characteristics, standard manufacturing equipment can be used. That is to say, the electrical characteristics can be tested using a standard socket having the same test terminals.

As shown in FIG. 4, on the lowest substrate 20 as external terminals projections 51 are formed. The projections 51 project from the lowest substrate 20, from the surface opposite to the surface facing the other substrates 20. The projections 51 may be formed from a conducting material such as solder or the like. In more detail, solder or the like may be provided on the second terminals 50 to form the projections. For example, the projections 51 may be formed by disposing solder cream or solder balls and forming by reflow, or by metal plating (electroplating or electroless plating).

Alternatively, in place of the projections 51 as external terminals, a convex portion formed by a locally bent construction of the interconnecting pattern 30 may be used. In this case, the second terminals 50 which are a part of the interconnecting pattern 30 are bent to form the external terminals.

The second terminals 50 formed on the lowest substrate 20 may be formed as electrical connections to other members. That is to say, the second terminals 50 may be terminals for external connection. For example, the second terminals 50 may be formed as electrical connections to a circuit board (motherboard) for mounting the semiconductor device.

In this case, the second terminals 50 are lands for providing external terminals. That is to say, without going to great lengths to provide external terminals, for example, when mounting on a circuit board using a solder cream spread on the circuit board, as a result of the surface tension when this is melted, external terminals may be formed, and the two electrically connected. This semiconductor device is a so-called land grid array type of semiconductor device. These embodiments, as described below, may be applied to the case in which the interconnecting pattern 30 is formed on both surfaces of the substrate 20.

Since the second terminals 50 are formed to be each large in plan form, and have a wide pitch, the semiconductor device can easily be mounted on a circuit board. In other words, by using the second terminals 50 for external connection, the semiconductor device can easily be positioned on the circuit board. By means of this, the yield when the semiconductor device is mounted can be increased and the throughput improved.

The method of manufacture of this embodiment of the semiconductor device is as described above. It should be noted that the above described testing of electrical characteristics includes an electrical test and burn-in or the like.

Second Embodiment

Figure 5:
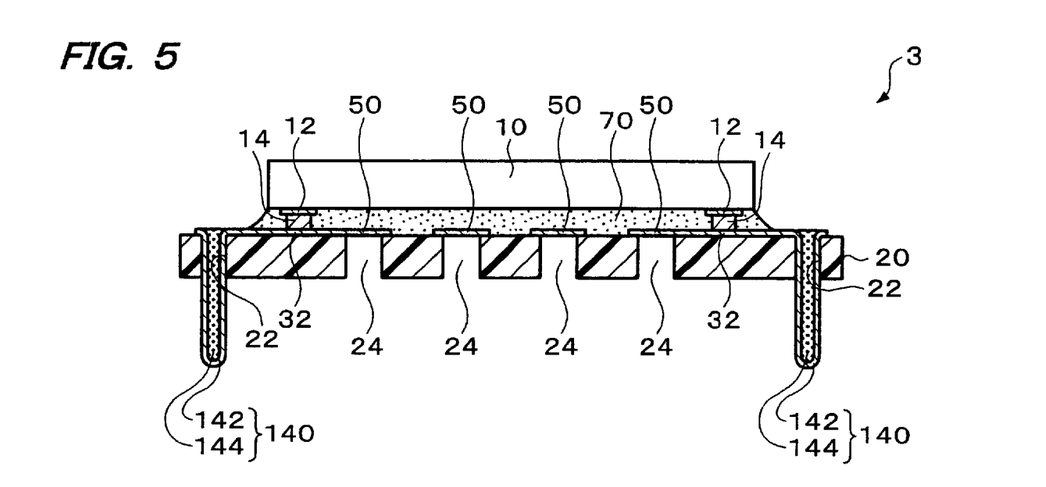
FIG. 5 shows a second embodiment of the semiconductor device to which the present invention is applied.
Figure 6:
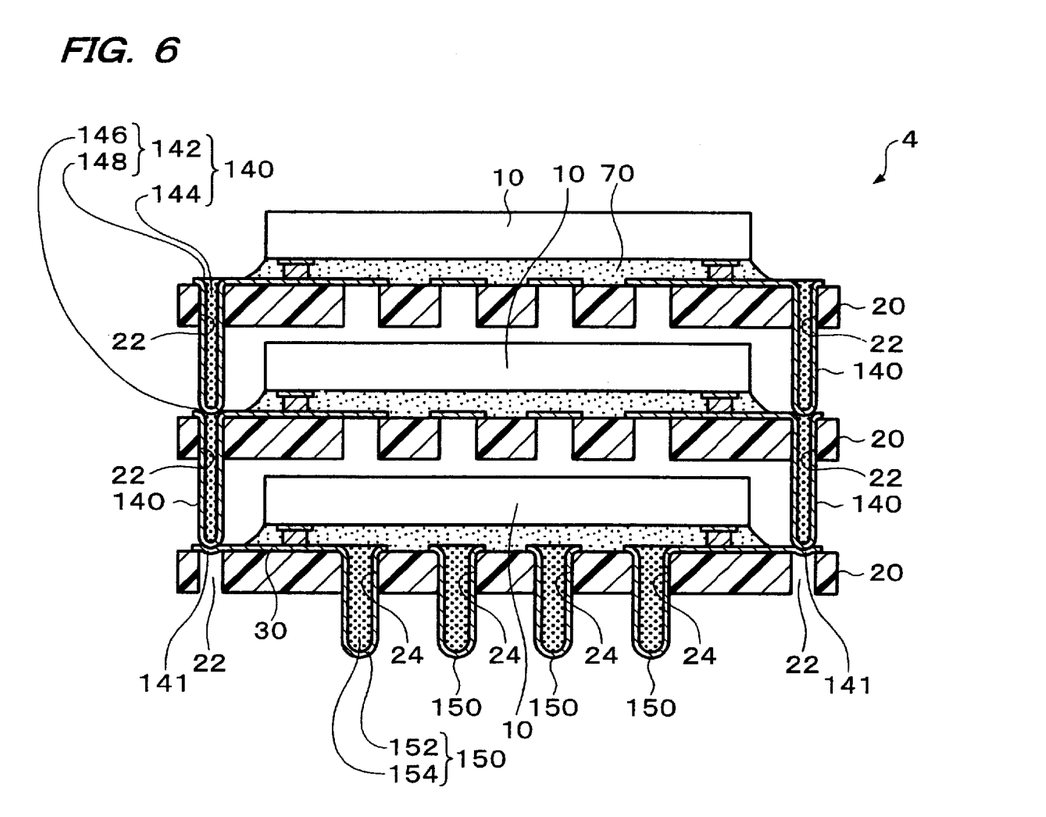
FIG. 6 shows a second embodiment of the semiconductor device to which the present invention is applied.

FIGS. 5 and 6 show this embodiment of a semiconductor device. A semiconductor device 3 shown in FIG. 5 differs from the above description in the form of first terminals 140. It should be noted that in all of the below described embodiments, the content of the description for other embodiments can as far as possible be applied.

The first terminals 140 include projections formed to protrude from the surface of the substrate 20. By means of the projections of the first terminals 140, when a plurality of substrates 20 is disposed in a laminated manner, upper and lower semiconductor chips 10 can be electrically connected.

The second terminals 50 may be formed so that in plan form they are larger than the projections of the first terminals 140. By means of this, via the second terminals 50, the electrical characteristics of the semiconductor device can easily be tested. Since the projections of the first terminals 140 can be formed to be small in the plan view of the substrate 20 by means of the formation of the second terminals 50, then for example, narrow pitch and high pin count can be supported. That is to say, the electrical characteristics can easily be tested, and a high density and compact semiconductor device can be provided.

The projections of the first terminals 140 have a height exceeding the thickness of the semiconductor chip 10 on the substrate 20, and may project from either surface of the substrate 20. In the example shown in FIG. 5, the projections of the first terminals 140 are formed to project from the surface of the substrate 20 opposite to the semiconductor chip 10. By means of this, the projections of the first terminals 140 can be bonded directly to the first terminals 140 of another substrate 20.

As shown in FIG. 5, the projections of the first terminals 140 may project from the surface of the substrate 20 opposite to the semiconductor chip 10, through the first through holes 22. In other words, the projections of the first terminals 140 may have their base ends positioned inside the first through holes 22, and passing through the first through holes 22, have their extremities projecting from the surface opposite to the semiconductor chip 10 on the substrate 20. By means of this, even when the interconnecting pattern 30 is formed on one surface of the substrate 20, electrical connection from both sides of the substrate 20 can be achieved.

In the example shown in FIG. 5, the projections of the first terminals 140 are formed by bending a part of the interconnecting pattern 30 away from the surface of the substrate 20. That is to say, the projections of the first terminals 140 may be bent portions 142 of the interconnecting pattern 30. For example, as shown in the drawings, the bent portions 142 may be formed by bending a part of the interconnecting pattern 30 formed on one surface of the substrate 20 into the first through holes 22, projecting in the direction away from the other surface of the substrate 20. An embodiment of this type may have convexities not shown in the drawings formed by extrusion from one surface of the substrate 20 into the first through holes 22. By means of this, the component count of the semiconductor device can be reduced and a low cost semiconductor device can be provided.

The bent portions 142 may be filled with a conducting material 144. The conducting material 144 may be a conducting paste, a solder paste or plating or the like.

Distinct from the above description, the projections of the first terminals 140 may be bumps (not shown in the drawings) provided on the interconnecting pattern 30. The bumps may be provided on lands of the interconnecting pattern 30. The bumps may project on the side of the substrate 20 opposite to that of the semiconductor chip 10 through the first through holes 22. In other words, the base end of the bumps may be disposed inside the first through holes 22, and the extremities of the bumps may project from the surface of the substrate 20 opposite to the semiconductor chip 10. The bumps are formed of gold, solder, or other conducting material.

The semiconductor device 4 shown in FIG. 6 is a semiconductor device of stacked construction. The laminated semiconductor devices may each be the above described semiconductor device 3. The semiconductor device 4 of this embodiment differs from the above described embodiment in the form of the first and second terminals 140 and 150.

In the semiconductor device 4, the semiconductor chips 10 of each substrate 20 are electrically connected in the vertical direction by the first terminals 140. The projections of the first terminals 140 are formed on the substrate 20 with a height exceeding the thickness of the semiconductor chip 10. By means of this, the extremities of the projections of the first terminals 140 can be bonded to other first terminals 140. For the bonding of the projections of the first terminals 140 and other first terminals 140, the above described bonding of the electrodes 12 (bumps 14) and the interconnecting pattern 30 may be applied.

When bent portions 142 of the interconnecting pattern 30 are used as the projections of the first terminals 140, convexities 146 of the bent portions 142 may be connected to concavities 148 of the bent portions 142 of other substrates 20. The convexities 146 of the bent portions 142 may enter the concavities 148 of the bent portions 142 of other substrates 20. In this case, both bent portions 142 are bonded inside the first through holes 22. Alternatively, as shown in FIG. 6, if the concavities 148 of the bent portions 142 are filled with the conducting material 144, the convexities 146 of the bent portions 142 may be bonded by the conducting material 144 without entering the concavities 148 of the other bent portions 142. In this case, both bent portions 142 may be bonded outside the first through holes 22. In the latter case, without wasting the height of the bent portions 142, the upper and lower semiconductor chips 10 can be connected.

When bumps are used for the projections of the first terminals 140, the form described for the above described embodiment can be applied (see FIG. 4).

As shown in the example in FIG. 6, first terminals 141 of the lowest substrate 20 may be a part of the interconnecting pattern 30 (lands). That is to say, if upper and lower semiconductor chips 10 are electrically connected by means of the projections of the first terminals 140 provided on some substrates 20, then first terminals 141 on one or a more of the substrates 20 (for example, the lowest substrate 20) need not be formed to project. It should be noted that the rest of the construction of the first terminals 141 may be the same as the first terminals 140.

As shown in FIG. 6, on the lowest substrate 20, external terminals may be formed. For example, the external terminals may be bent portions 152 of the interconnecting pattern 30 formed by bending the second terminals 150 which are a part of the interconnecting pattern 30. The bent portions 152 may have the same form as the bent portions 142 of the first terminals 140, and may be filled with a conducting material 154. However, the bent portions 152 of the second terminals 150 are each formed to be larger in plan form than the first terminals 140. By means of this, the semiconductor device 4 can easily be positioned for example on a circuit board.

On the lowest substrate 20, in place of the bent portions 152 of the interconnecting pattern 30, the projections described in the first embodiment (for example, solder balls or the like) may be provided on the interconnecting pattern 30 as external terminals.

The method of manufacture of this embodiment of the semiconductor device is as already described. It should be noted that according to this embodiment, the same benefits can be obtained as with the above described embodiment.

Variant

Figure 7:
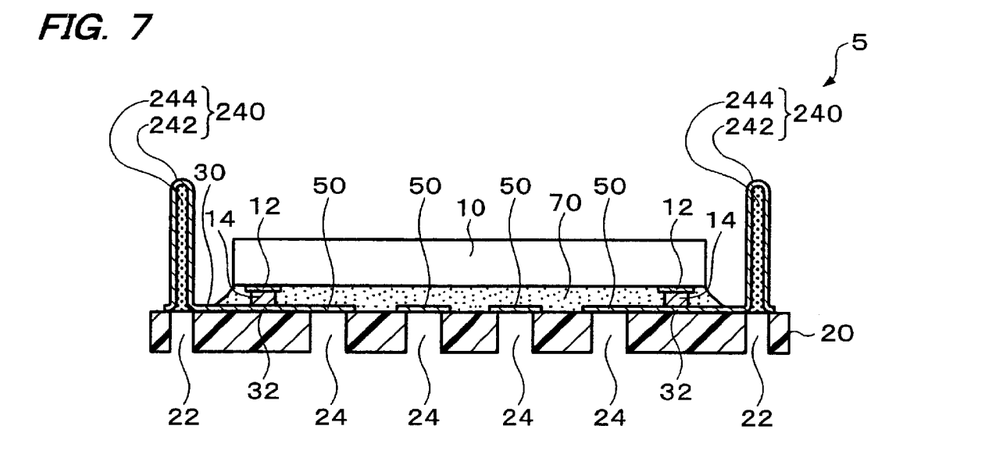
FIG. 7 shows a variant of the second embodiment of the semiconductor device to which the present invention is applied.
Figure 8:
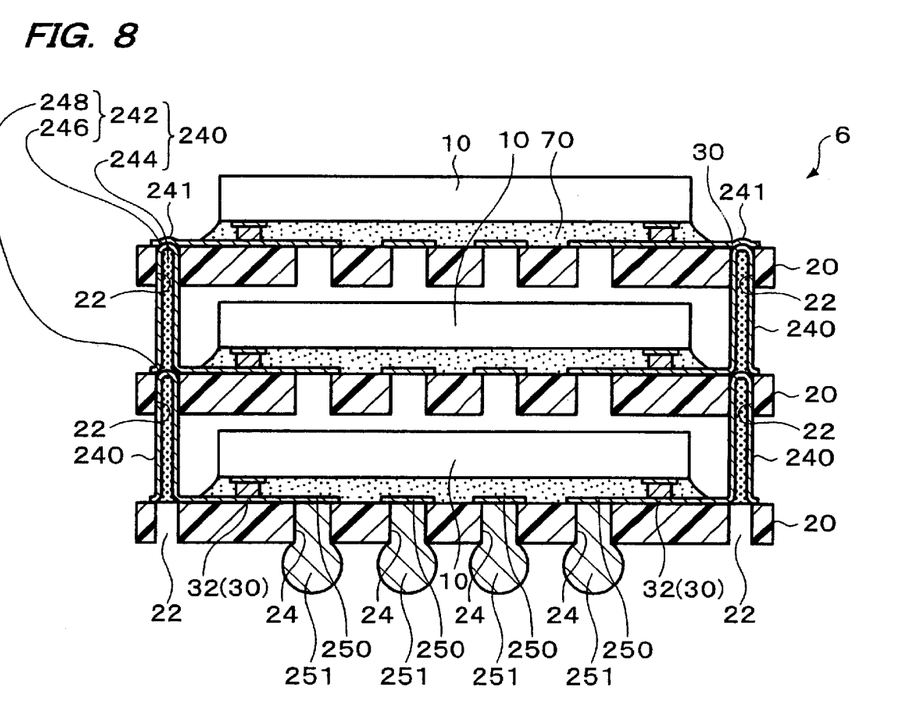
FIG. 8 shows a variant of the second embodiment of the semiconductor device to which the present invention is applied.

FIGS. 7 and 8 show a variant of this embodiment of the semiconductor device. A semiconductor device 5 shown in FIG. 7 differs from the above description in the form of projections of first terminals 240.

In the example shown in FIG. 7, the first terminals 240 are formed over the first through holes 22, and the projections are formed to project in the opposite direction to the first through holes 22. The projections of the first terminals 240 may be formed projecting from the surface of the substrate 20 on the side of the semiconductor chip 10. The projections of the first terminals 240 may be formed on the substrate 20 with a height exceeding the thickness of the semiconductor chip 10. The projections of the first terminals 240 may be formed with a diameter smaller than the first through holes 22. By means of this, for example, as shown in the semiconductor device 6 of stacked construction in FIG. 8, the projections of the first terminals 240 penetrate the first through holes 22 in other substrates 20, and the first terminals 240 can be connected together.

In the example shown in FIG. 7, the projections of the first terminals 240 are bent portions 242 of the interconnecting pattern 30. As shown in the drawing, the bent portions 242 may be formed by bending a part of the interconnecting pattern 30 formed on one surface of the substrate 20 in the opposite direction to the first through holes 22, thus projecting in the direction away from one surface of the substrate 20. An embodiment of this type may be formed by extrusion of, for example, convexities not shown in the drawings from the inside of the first through holes 22 in the substrate 20, on the side on which the interconnecting pattern 30 is formed.

The interior of the bent portions 242 may be filled with a conducting material 244. The conducting material 244 may be provided to protrude from concavities 248 in the bent portions 242, for example, extending as far as inside the first through holes 22.

Alternatively, the projections of the first terminals 240 may be bumps (not shown in the drawings) provided on the interconnecting pattern 30. For example, the bumps maybe formed over the first through holes 22 in the interconnecting pattern 30, on the surface of the interconnecting pattern 30 opposite to that facing the substrate 20.

As shown in FIG. 8, a semiconductor device 6 includes a plurality of semiconductor devices 5. The semiconductor chip 10 of each substrate 20 is electrically connected in the vertical direction by the first terminals 240. In this variant, the form of the first and second terminals 240 and 250 is different from above.

In the example shown in FIG. 8, the projections of the first terminals 240 are bent portions 242 of the interconnecting pattern 30. Convexities 246 of the bent portions 242 are connected to the surface of another interconnecting pattern 30 on the side facing the substrate 20. In this case, the bent portions 242 are bonded to other bent portions 242 through the first through holes 22. The convexities 246 of the bent portions 242 may penetrate the concavities 248 in the bent portions 242 of other substrates 20. In this case, both bent portions 242 are bonded outside the first through holes 22. Alternatively, by filling the concavities 248 with the conducting material 244, bonding without penetrating the concavities 248 in other bent portions 242 is possible. In the latter case, upper and lower semiconductor chips 10 can be connected without wasting the height of the bent portions.

As shown in the example in FIG. 8, first terminals 241 of the uppermost substrate 20 may be a part of the interconnecting pattern 30 (lands). It should be noted that other aspects of the construction of the first terminals 241 may be the same as the first terminals 240.

As shown in FIG. 8, on the lowest substrate 20, as external terminals projections 251 may be formed. The projections 251 are provided on second terminals 250. The projections 251 may have the same form as the above described projections 51. The projections 251 may be formed to be larger in plan form than the first terminals 240. By means of this, the semiconductor device 6 can easily be positioned, for example on a circuit board. As external terminals, a bent form of the above described second terminals 250 may be applied. It should be noted that in this variant also, the same benefit as described above can be obtained.

Third Embodiment

Figure 9:
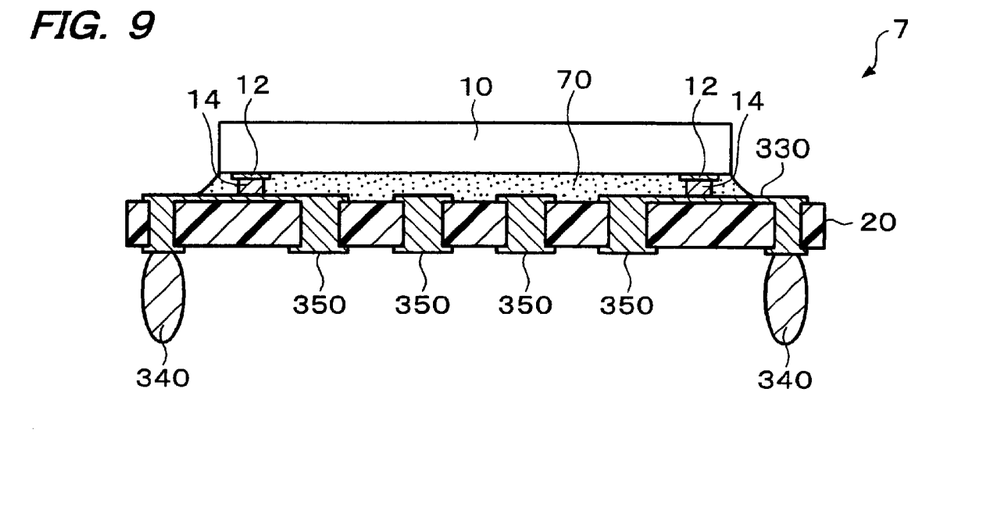
FIG. 9 shows a third embodiment of the semiconductor device to which the present invention is applied.
Figure 10:
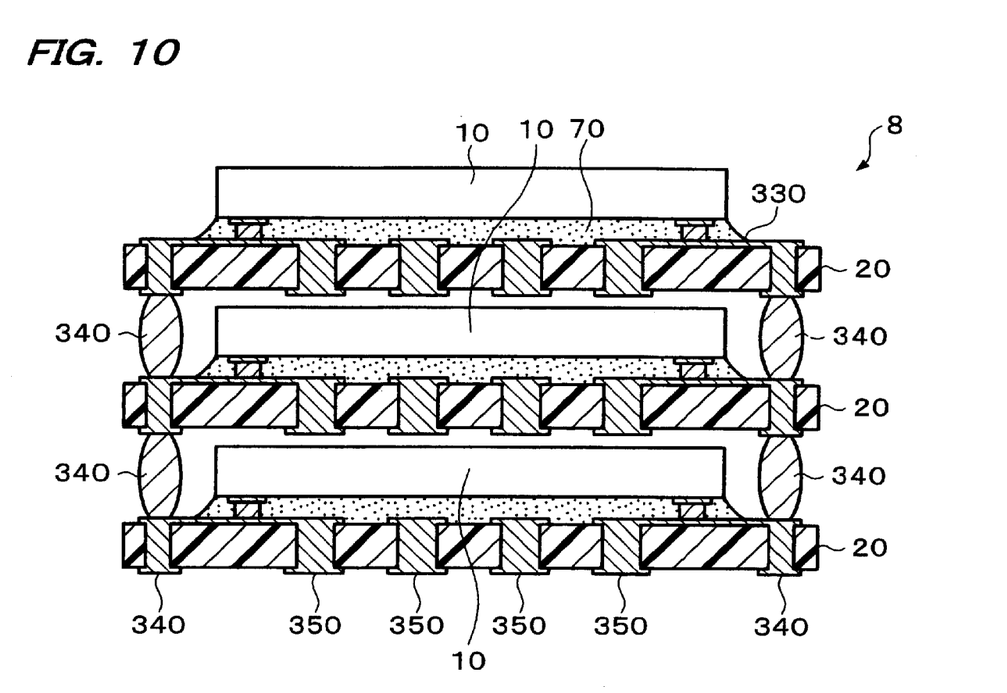
FIG. 10 shows a third embodiment of the semiconductor device to which the present invention is applied.

FIGS. 9 and 10 show this embodiment of a semiconductor device. The semiconductor device shown in FIG. 9 differs from the above described example in the form of an interconnecting pattern 330 formed on the substrate 20.

In this embodiment, the interconnecting pattern 330 is formed on both surfaces of the substrate 20. As shown in FIG. 9, by means of a plurality of through holes in the substrate 20, an interconnecting pattern 330 may be formed with both surfaces electrically connected. The through holes, as shown in the drawing, may be filled with the material of the interconnecting pattern 330. Alternatively, the through holes may have through holes formed in a central portion, and be vertically electrically conducting on the periphery formed by the inner wall. It should be noted that the interconnecting pattern 330 may be formed by provision of a conducting material in the through holes different from that of the interconnecting lines on the substrate 20.

As shown in FIG. 9, the interconnecting pattern 330 may be formed only on the surface opposite to that of the semiconductor chip 10, in the positions where first and second terminals 340 and 350 are provided. Alternatively, through holes may be provided in other positions, and interconnecting lines may be formed on the surface of the substrate 20 opposite to the semiconductor chip 10, connecting to the first and second terminals 340 and 350.

In the example shown in FIG. 9, first terminals 340 include projections. The projections of the first terminals 340 may, for example, be bumps. The bumps may be formed with a height exceeding the semiconductor chip 10 on the substrate 20.

On the other hand, the second terminals 350 may be a part of the interconnecting pattern 330. The second terminals 350 may be lands of the interconnecting pattern 330.

As shown in FIG. 9, the projections of the first terminals 340 may be formed on the surface of the substrate 20 opposite to the semiconductor chip 10. Alternatively, they maybe formed on the surface of the substrate 20 on the side of the semiconductor chip 10.

It should be noted that in the form of this embodiment of the semiconductor device 7, the above described embodiments can be applied as far as possible.

A semiconductor device 8 shown in FIG. 10 is a semiconductor device of stacked construction. The laminated semiconductor devices may each be the above described semiconductor device 7. In this embodiment also, the second terminals 350 are formed to be larger in plan form than the first terminals 340. With the semiconductor device of this embodiment, the same benefit as described above can be obtained. Naturally, as described in the first and second embodiments, projections (for example, solder balls or the like) may be formed over the second terminals 350.

Figure 11:
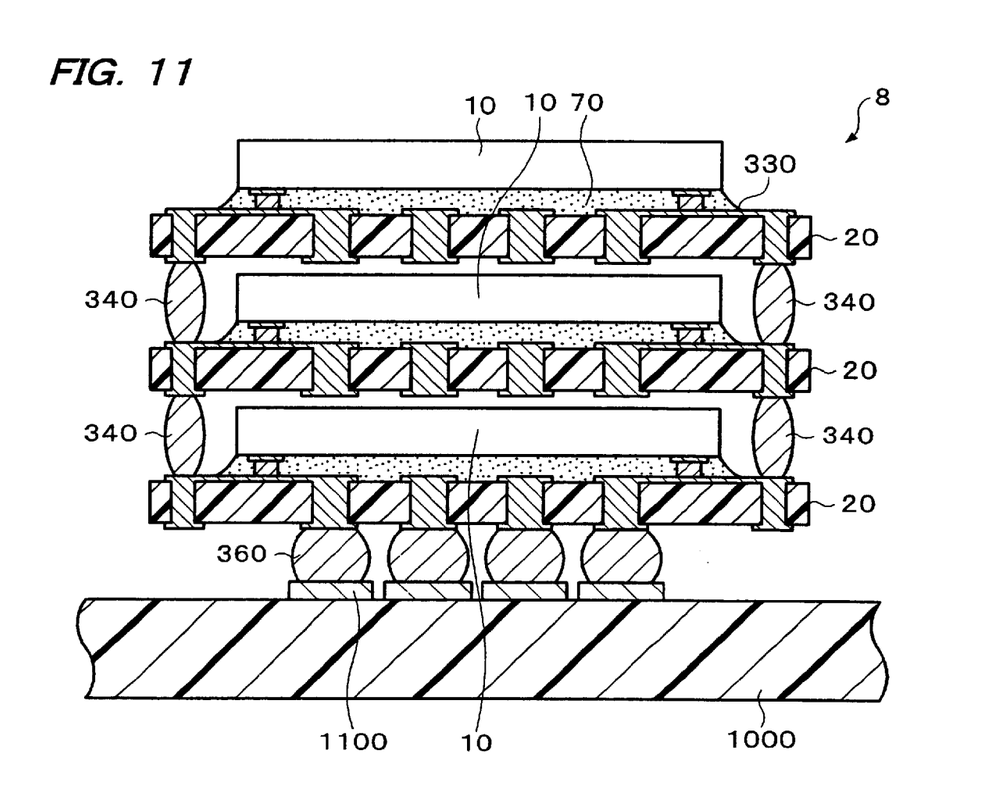
FIG. 11 shows a circuit board on which is mounted the embodiment of the semiconductor device to which the present invention is applied.

FIG. 11 shows a circuit board 1000 on which is mounted the semiconductor device 8 of the above described embodiment. An organic substrate such as, for example, a glass epoxy substrate or the like is generally used for the circuit board 1000. On the circuit board 1000, an interconnecting pattern 1100 is formed in a desired circuit, for example, of copper or the like, and this interconnecting pattern 1100 is electrically connected with the second terminals 340 of the semiconductor device 8. The bonding between the two may be achieved with a conducting material 360 such as solder or the like.

Figure 12:
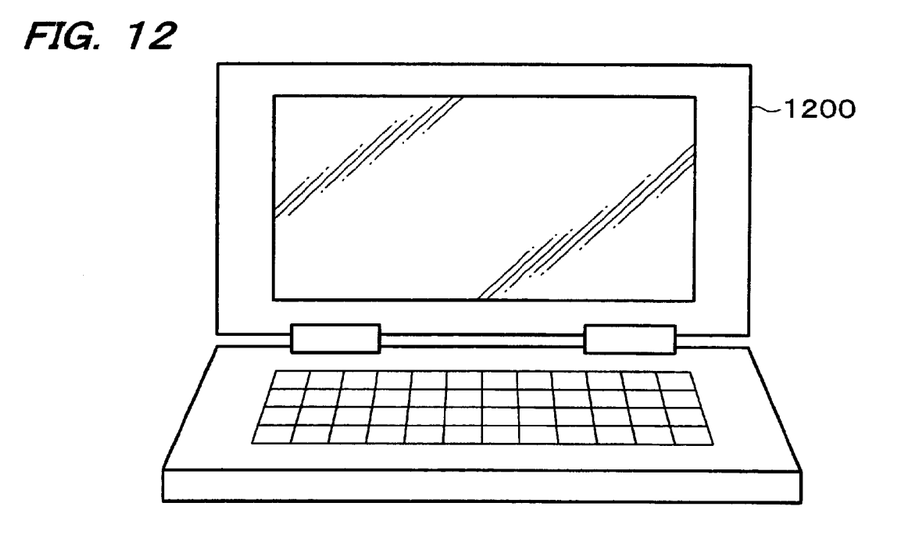
FIG. 12 shows an electronic instrument having the embodiment of the semiconductor device to which the present invention is applied.
Figure 13:
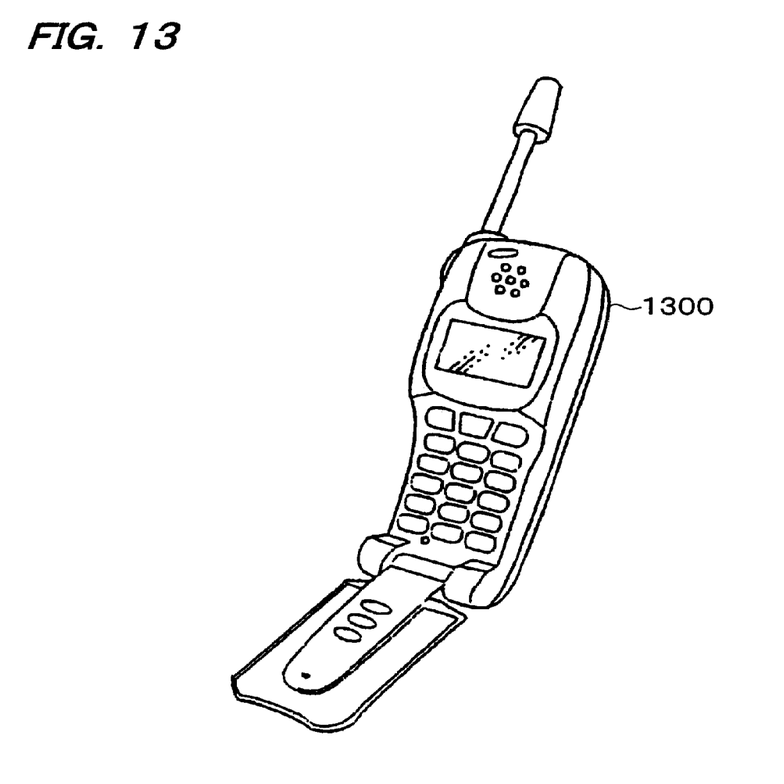
FIG. 13 shows an electronic instrument having the embodiment of the semiconductor device to which the present invention is applied.

Then as an electronic instrument having a semiconductor device to which the present invention is applied, FIG. 12 shows a notebook personal computer 1200, and FIG. 13 shows a mobile telephone 1300.

In all of the above described embodiments, examples are described in which a semiconductor chip is mounted on one side only of a substrate, but this is not limiting of the present invention, and a semiconductor chip may be mounted on both sides of the substrate, and this may then be laminated.

What is claimed is:

1. A semiconductor device comprising:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals.

2. The semiconductor device of claim 1, wherein:

the second terminals are formed to be larger in plan form than the first terminals.

3. The semiconductor device of claim 1, wherein:

the pitch of the second terminals is wider than the pitch of the first terminals.

4. The semiconductor device of claim 1, wherein:

the first terminals are formed at an extremity of the substrate and arranged along an edge of the semiconductor chip; and the second terminals are formed in a region including the region in which the semiconductor chip is mounted.

5. The semiconductor device of claim 1, wherein:

the interconnecting pattern is formed on each of both surfaces of the substrate.

6. The semiconductor device of claim 1, wherein:

the substrate has the interconnecting pattern formed over its surface on which the semiconductor chip is mounted, and the substrate has a plurality of first and second through holes formed therethrough in its portion overlapping with the interconnecting pattern;

the first terminals are positioned over the first through holes; and the second terminals are provided to be exposed through the second through holes.

7. The semiconductor device of claim 6, wherein:

the first terminals have projections formed to project from a surface of the substrate.

8. The semiconductor device of claim 7, wherein:

the projections of the first terminals are formed with a height exceeding the thickness of the semiconductor chip on the substrate, the projections projecting from either surface of the substrate.

9. The semiconductor device of claim 7, wherein:

the projections of the first terminals are formed to project through the first through holes from a surface of the substrate opposite to a surface on which the semiconductor chip is mounted.

10. The semiconductor device of claim 7, wherein:

the projections of the first terminals are bumps provided so as to be electrically connected to the interconnecting pattern.

11. The semiconductor device of claim 7, wherein:

the first terminals are a part of the interconnecting pattern.

12. The semiconductor device of claim 11, wherein:

the projections of the first terminals are formed by bending a part of the interconnecting pattern in the direction away from a surface of the substrate.

13. A semiconductor device comprising a plurality of stacked semiconductor devices, wherein each of the stacked semiconductor devices comprises:

a semiconductor chip;

a substrate having an interconnecting pattern formed thereover, the substrate having the semiconductor chip mounted on a surface thereof, the substrate having an outline larger than the semiconductor chip;

first terminals formed in a region outside a region of the substrate in which the semiconductor chip is mounted; and second terminals being a part of the interconnecting pattern which exposes its surface opposite to a surface opposing the semiconductor chip in a region closer to a center of the substrate than the first terminals, wherein the semiconductor chip is electrically connected to the first and second terminals, wherein the semiconductor chips in upper and lower ones of the stacked semiconductor devices are electrically connected.

14. The semiconductor device of claim 13, further comprising:

external terminals, the substrate of the lowest one of the stacked semiconductor devices having the external terminals, the external terminals projecting from a surface of the substrate opposite to a surface opposing the substrate of another of the stacked semiconductor devices.

15. The semiconductor device of claim 14, wherein:

the external terminals are formed by bending a part of the interconnecting pattern including the second terminals in the direction away from a surface of the substrate.

16. The semiconductor device of claim 15, wherein:

the external terminals are provided so as to be electrically connected to the second terminals.

17. A circuit board having the semiconductor device of claim 13 mounted thereon, the circuit board electrically connected to the semiconductor device by the second terminals which the substrate of the lowest one of the stacked semiconductor devices have.

18. An electronic instrument having the semiconductor device of claim 13.

19. A method of manufacture of a semiconductor device comprising the step of testing an electrical characteristics of the semiconductor device of claim 1 through the second terminals which the substrate have.

20. A method of manufacture of a semiconductor device comprising the step of testing an electrical characteristics of the semiconductor device of claim 13 through the second terminals which the substrate of the lowest one of the stacked semiconductor devices have.

* * * * *